(12) United States Patent
Binette et al.

(10) Patent No.: US 7,696,770 B2
(45) Date of Patent: Apr. 13, 2010

(54) SELF-CENTERING NEST FOR ELECTRONICS TESTING

(75) Inventors: Francois Binette, Cowansville (CA); Jerome Bougie, Bromont (CA); Andre Chouinard, Granby (CA)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 11/627,661

(22) Filed: Jan. 26, 2007

(65) Prior Publication Data

US 2008/0180128 A1    Jul. 31, 2008

(51) Int. Cl.
G01R 31/26 (2006.01)
G01R 31/02 (2006.01)

(52) U.S. Cl. .................. 324/765; 324/755
(58) Field of Classification Search .......... 324/765, 324/755, 758, 760, 158.1; 438/14–18; 257/48; 439/71, 264

See application file for complete search history.

(56) References Cited

U.S. PATENT DOCUMENTS

| | | | |
|---|---|---|---|
| 4,436,385 A | 3/1984 | Fischer et al. | |
| 5,748,007 A | 5/1998 | Gaschke | |
| 6,005,386 A | 12/1999 | Cadwallader et al. | |
| 6,043,667 A | 3/2000 | Cadwallader et al. | |
| 6,146,256 A | 11/2000 | Joo | |
| 6,285,202 B1 * | 9/2001 | Hembree | 324/755 |
| 6,359,452 B1 | 3/2002 | Mozzetta | |
| 6,712,672 B1 | 3/2004 | Joo | |
| 6,765,397 B2 | 7/2004 | Corbin, Jr. et al. | |
| 7,471,096 B2 * | 12/2008 | Kohashi et al. | 324/755 |

OTHER PUBLICATIONS

Wafer Centering Fixture, [product description], [online]; [retrieved on Jul. 28, 2006]; retrieved from the Internet http://www.ip.com/pubview/IPCOM000075366D.

* cited by examiner

Primary Examiner—Ha Tran T Nguyen
Assistant Examiner—Tung X Nguyen
(74) Attorney, Agent, or Firm—Cantor Colburn LLP; Yuanmin Cai

(57) ABSTRACT

The shortcomings of the prior art are overcome and additional advantages are provided through the provision of a self-centering nest for testing of microprocessor chip modules. The self-centering nest includes two slideable jaws disposed on a base diagonally opposite each other. Each jaw includes a jaw pin that is receptive in a carrier, such that when the jaw pins are received in the carrier, the jaws are in an open position. The self-centering nest includes a transfer mechanism for urging a microprocessor chip module from the carrier into the self-centering nest. The self-centering nest includes a plurality of springs, each spring having a first end connected to the first slideable jaw and a second end connected to the second slideable jaw. The springs cause the jaws to move toward each other capturing and centering the microprocessor chip module when the jaws are pulled away from the carrier releasing the jaw pins.

8 Claims, 2 Drawing Sheets

SELF-CENTERING NEST FOR ELECTRONICS TESTING

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to the testing of integrated circuit modules, and particularly to an apparatus for securing and centering an integrated circuit module for testing.

2. Description of Background

When modules comprising microprocessor chips are manufactured, the modules are typically subject to functional testing. The testing is performed to determine a module's individual performance, or to burn in the module at various operating voltages, clock speeds, and power levels, while the module is in a known operating range.

Test fixtures are utilized to locate the module in a proper orientation and to hold the module in place for testing. The test fixtures, however, are often configured to accommodate the largest module allowed by the module's design specifications. For example, if a square-shaped module design is 25 mm×25 mm+/−0.2 nm, the test fixture will be designed and manufactured for a module that is 25.2 μm×25.2 mm. When a smaller module, within its design tolerance, is placed in the test fixture, the smaller module may rotate or otherwise move in the test fixture. The movement or rotation can cause an open circuit or a short circuit during testing, can increase wear of the test fixture, and can increase overall test time because of additional retesting that is required.

What is needed is a test fixture that automatically adjusts to the size of the module to be tested, therefore reducing issues described above.

SUMMARY OF THE INVENTION

The shortcomings of the prior art are overcome and additional advantages are provided through the provision of a self-centering nest for testing of microprocessor chip modules. The self-centering nest includes two slideable jaws disposed on a base diagonally opposite each other. Each jaw includes a jaw pin that is sized and configured to be receptive in a carrier, such that when the jaw pins are received in the carrier, the first jaw and the second jaw are in an open position. The self-centering nest includes a transfer mechanism for urging a microprocessor chip module from the carrier into the self-centering nest.

The self-centering nest includes a plurality of springs, each spring having a first end connected to the first slideable jaw and a second end connected to the second slideable jaw. When the centering nest holding the module is pulled away from the carrier and the jaw pins disengage from the carrier, the springs cause the first jaw and the second jaw to move toward each other capturing and centering the microprocessor chip module.

Additional features and advantages are realized through the techniques of the present invention. Other embodiments and aspects of the invention are described in detail herein and are considered a part of the claimed invention. For a better understanding of the invention with advantages and features, refer to the description and to the drawings.

Technical Effects

As a result of the summarized invention, technically we have achieved a solution which automatically centers a module for testing, thus reducing short circuits and open circuits during testing. The reduction of the short and open circuits reduces overall testing time and testing cost because of the reduction in the amount of retesting required.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
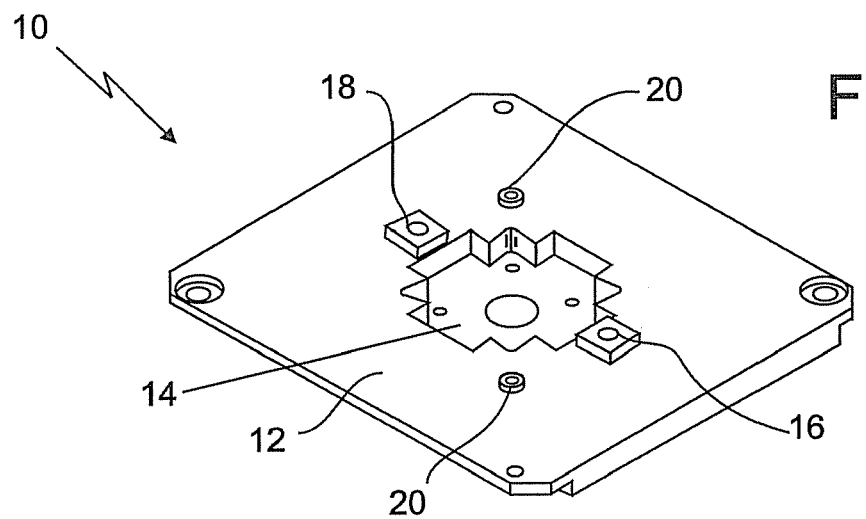
FIG. 1 illustrates one example of a carrier.

Turning now to the drawings in greater detail, it will be seen that in FIG. 1 there is a carrier 10 for carrying a microprocessor chip module. The carrier 10 comprises a carrier plate 12 having a recess 14 configured to accept a microprocessor chip module (not shown). The recess 14 shown in FIG. 1 is shaped to accommodate a substantially square module, but the recess 14 may be configured to accommodate modules having other shapes. The carrier 10 includes a circular hole bushing 16 and slotted hole bushing 18 disposed in the carrier plate 12. In the embodiment shown in FIG. 1, the circular hole bushing 16 and the slotted hole bushing 18 are disposed at opposite ends of the recess 14, but other relative positions of the bushings 16 and 18 are contemplated. The carrier 10 further includes two nest pin holes 20. The nest pin holes 20 are disposed at opposite corners of the recess 14.

Figure 2:
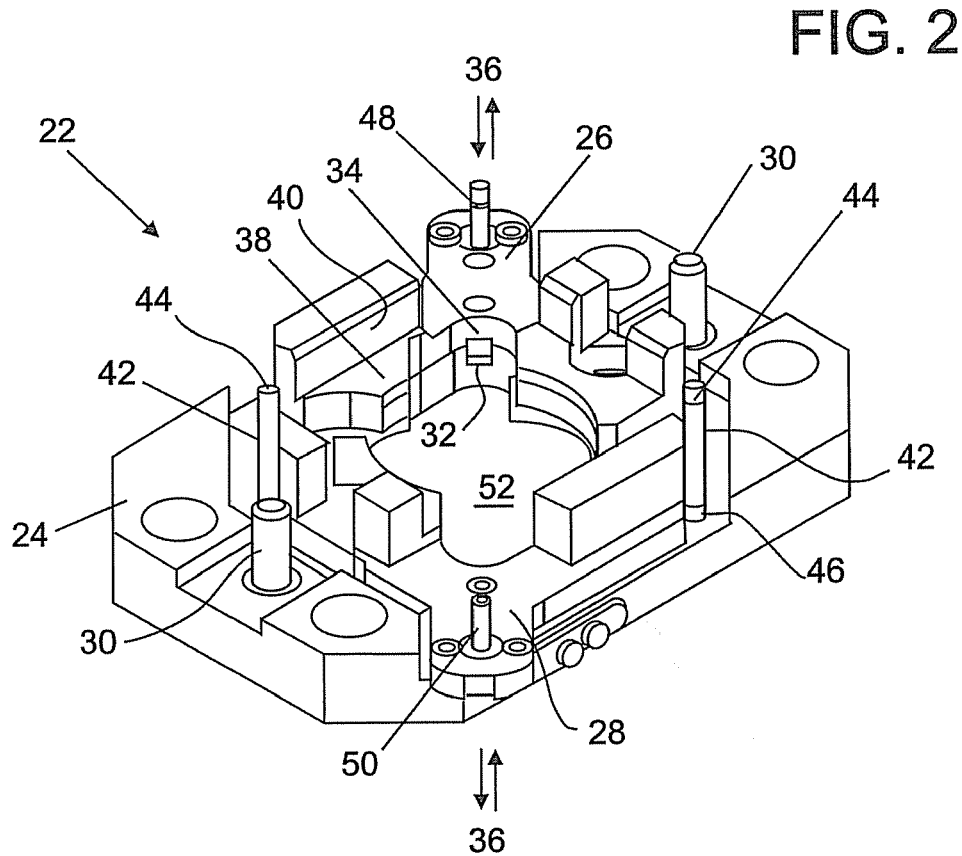
FIG. 2 illustrates one example of a self-centering nest.

FIG. 2 illustrates a self-centering nest 22. The self-centering nest comprises a nest base 24 with a first sliding jaw 26 and a second sliding jaw 28 disposed thereon. The base 24 includes two base pins 30 configured and located such that one base pin 30 is engageable in the circular hole bushing 16 of FIG. 1 and the other base pin 30 is simultaneously engageable in the slotted hole bushing 18 of FIG. 1.

The base 24 includes two sliders 32 disposed diagonally opposite each other on the base as illustrated in FIG. 2. Each jaw 26, 28 includes a corresponding groove 34, that, when engaged with a slider 32 allows each jaw 26, 28 to slide in a diagonal direction 36. Each jaw 26, 28 further includes a jaw face 38 and jaw wall 40 disposed substantially perpendicular to the jaw face 38. Two or more springs 42 are utilized to pull the first jaw 26 toward the second jaw 28. In the embodiment shown in FIG. 2, the first jaw 26 includes two first spring pins 44 disposed at opposite sides of first jaw 26, and the second jaw 28 includes two second spring pins 46 disposed at opposite sides of second jaw 28. Each spring 42 is affixed at one end to a first spring pin 44 of the first jaw 26, and at another end to a second spring pin 46 of the second jaw 28. The first jaw 26 further includes a first jaw pin 48, and the second jaw 28 further includes a second jaw pin 50. The first jaw pin 48 and the second jaw pin 50 are configured and located to be receivable into the nest pin holes 20 of FIG. 1.

With a chip module inserted in the recess 14 of FIG. 1, the self-centering nest 22 is positioned over the carrier 10, the base pins 30 are inserted into the circular hole bushing 16 and the slotted hole bushing 18. The first jaw pin 48 and the second jaw pin 50 are inserted in their respective nest pin holes 20, which holds the first jaw 26 and the second jaw 28 in an expanded state over the module. A transfer mechanism (not shown) urges the module away from the carrier 10 and up to the jaw faces 36. In one example, the transfer mechanism is a vacuum drawn through a center opening 52 in the self-centering nest 22, but the transfer mechanism may comprise a gripper mechanism or other means.

The self-centering nest 22, with the module held against the jaw faces 36, is pulled away from the carrier 10 and toward a test socket 54 described in detail below. When the self-centering nest 22 is pulled away from the carrier 10, the jaw pins 48 and 50 disengage from the nest pin holes 20, and the springs 42 pull the first jaw 26 and the second jaw 28 toward each other to grasp and center the module in the self-centering nest 22.

Figure 3:
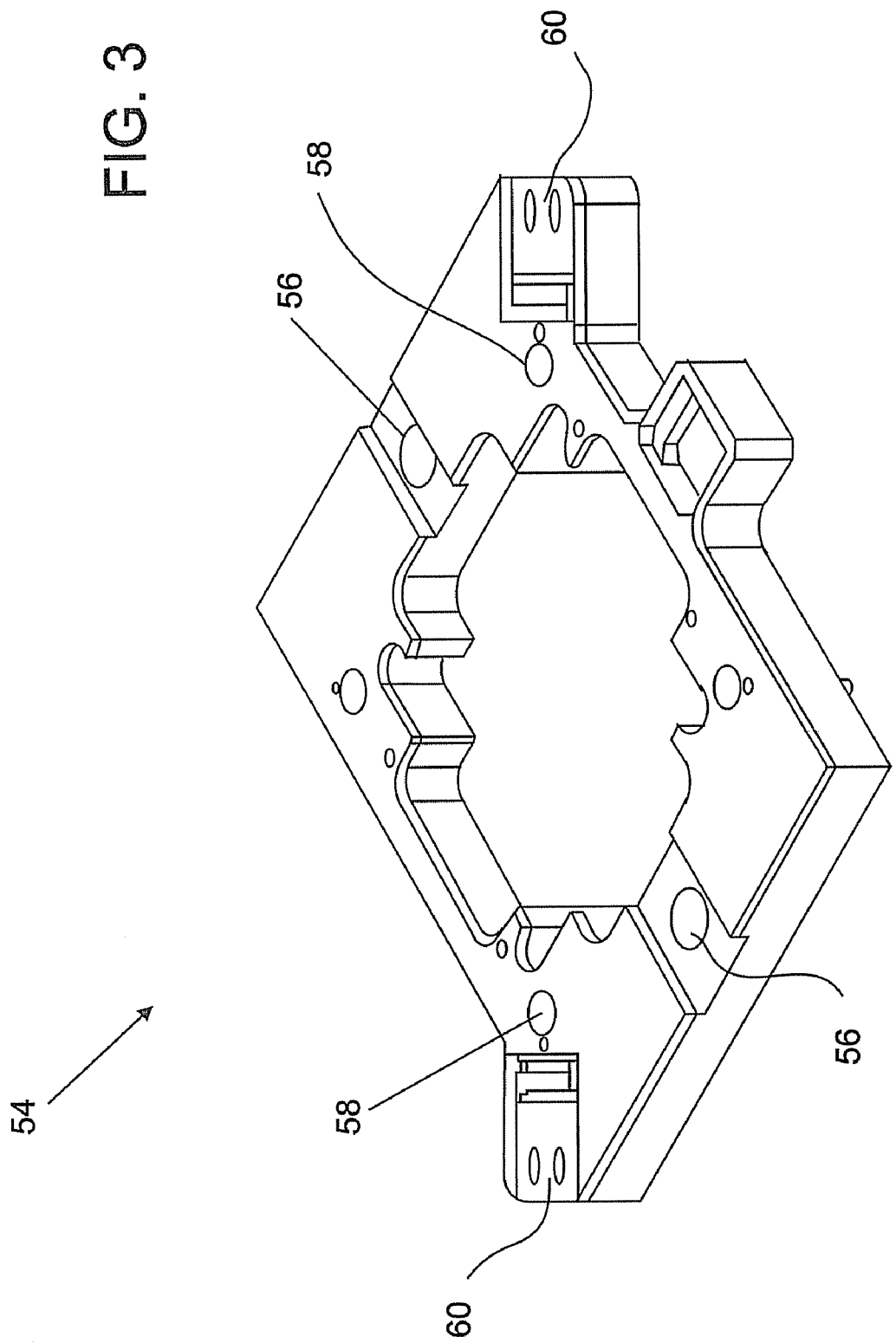
FIG. 3 illustrates one example of a test socket.

The self-centering nest 22 carries the module to the test socket 54, shown in FIG. 3. The test socket 54 includes two socket holes 56 located to be receptive to the base pins 30. The test socket 54 further includes two socket pin holes 58 arranged and configured to be receptive to the first jaw pin 48 and the second jaw pin 50. The self-centering nest 22 carrying the module is positioned over the test socket 54, the base pins 28 are inserted into the socket holes 56, and the first jaw pin 48 and the second jaw pin 50 are inserted into the socket pin holes 58. Leaf springs 60, disposed at each socket pin hole 58 engage the first jaw pin 48 and the second jaw pin 50, urging the first jaw pin 48 and the second jaw pin 50 toward the center of the self-centering nest 22, further centering the module in the self-centering nest 22.

When engaged in the test socket 54, the module is tested. When testing is completed, the self-centering nest 22 is pulled away from the test socket 54, and the module is returned to the carrier 10 by reversing the procedure described above.

Utilization of the self-centering nest 22 ensures that the module is restrained and centered for testing. Proper centering of the module reduces the incidence of short circuits of open circuits during testing. Reduction of these issues reduces overall test time and cost because of the reduction of retesting required due to these issues.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A self-centering nest for testing of microprocessor chip modules comprising:
   a base;
   first and second slideable jaws disposed on the base diagonally opposite each other;
   a jaw pin disposed in each jaw, the jaw pin receivable in a carrier such that when the jaw pins are received in the carrier the first jaw and second jaw are in an open position;
   a transfer mechanism in operable communication with the self-centering nest for urging a microprocessor chip module from the carrier into the self-centering nest;
   a plurality of springs, each spring having a first end connected to the first slideable jaw and a second end connected to the second slideable jaw, the springs causing the jaws to move toward each other capturing and centering the microprocessor chip module when the jaws are pulled away from the carrier releasing the jaw pins.

2. The self-centering nest of claim 1 wherein the base includes a plurality of locating pins receptive in the carrier, the locating pins, when received in the carrier, align the self-centering nest with the carrier.

3. The self-centering nest of claim 1 wherein the transfer mechanism is a vacuum source.

4. The self-centering nest of claim 1 wherein the transfer mechanism is a gripper mechanism.

5. A method for centering a microprocessor chip module for testing comprising:
   placing a microprocessor chip module in a carrier;
   lowering a self-centering nest onto the carrier, a plurality of jaw pins being received in the carrier thus urging a first jaw and a diagonally opposed second jaw of the self-centering nest into an open position;
   urging the microprocessor chip module from the carrier into the self-centering nest;
   disengaging the jaw pins from the carrier allowing the first jaw and the second jaw to be urged toward each other securing and centering the microprocessor chip module between the first jaw and the second jaw; and
   engaging the self-centering nest with a test socket.

6. The method of claim 5 wherein the microprocessor chip module is urged from the carrier into the self-centering nest by a vacuum.

7. The method of claim 5 wherein the first jaw and the second jaw are urged together by a plurality of springs, each spring having a first end connected to the first jaw and a second end attached to the second jaw.

8. The method of claim 5 further comprising adjusting a position of the microprocessor chip module with leaf springs disposed in the test socket at the jaw pins, the leaf springs further urging the first jaw and second jaw toward each other.

* * * * *